United States Patent
Singh et al.

(10) Patent No.: US 6,518,146 B1
(45) Date of Patent: Feb. 11, 2003

(54) SEMICONDUCTOR DEVICE STRUCTURE AND METHOD FOR FORMING

(75) Inventors: Rana P. Singh, Austin, TX (US); Paul A. Ingersoll, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/045,863

(22) Filed: Jan. 9, 2002

(51) Int. Cl.[7] .............................................. H01L 21/76
(52) U.S. Cl. ...................... 438/427; 438/424; 438/425; 438/426; 257/510; 257/513
(58) Field of Search ................................ 438/427, 425, 438/426, 424; 257/510, 513

(56) References Cited

U.S. PATENT DOCUMENTS

| | | | |
|---|---|---|---|
| 5,395,780 A | | 3/1995 | Hwang |
| 5,438,016 A | * | 8/1995 | Figura et al. ................ 438/427 |
| 5,472,904 A | * | 12/1995 | Figura et al. ......... 148/DIG. 50 |
| 5,605,848 A | | 2/1997 | Ngaoaram |
| 5,646,063 A | * | 7/1997 | Mehta et al. ......... 148/DIG. 50 |
| 5,683,946 A | | 11/1997 | Lu et al. |
| 5,712,208 A | | 1/1998 | Tseng et al. |
| 5,726,087 A | | 3/1998 | Tseng et al. |
| 5,753,962 A | * | 5/1998 | Jeng ............................ 257/296 |
| 5,837,596 A | * | 11/1998 | Figura et al. ................ 438/446 |
| 6,093,659 A | | 7/2000 | Grider et al. |

OTHER PUBLICATIONS

K.V. Rao et al., "Trench Capacitor Design Issues In VLSI DRAM Cells", 1986 IEEE, Section 6, 4 pgs.

* cited by examiner

*Primary Examiner*—Trung Dang
(74) *Attorney, Agent, or Firm*—James L. Clingan, Jr.; Robert L. King

(57) ABSTRACT

A semiconductor device has both a logic section and a non-volatile memory (NVM) section. Transistors in both sections are separated by trench isolation. The logic isolation has narrower trenches than NVM trenches and both types of trenches have corners at the tops thereof. The trenches are lined by growing an oxide that is necessarily to take care of the plasma damage of the substrate, which is preferably silicon, that occurs during the formation of the trenches. These oxide liners are grown to a greater thickness in the NVM trenches than in the logic trenches to obtain a greater degree of corner rounding in the NVM trenches. This growth differential is achieved by selectively implanting the NVM trenches with a species that speeds oxide growth or selectively implanting the logic trenches with a species that retards oxide growth. As a further alternative, the NVM trenches can be implanted with a growth enhancing species and the logic trenches with a retarding species.

21 Claims, 3 Drawing Sheets

SEMICONDUCTOR DEVICE STRUCTURE AND METHOD FOR FORMING

RELATED APPLICATIONS

U.S. patent application Ser. No. 09/997,145, entitled "Semiconductor Device Structure and Method for Forming," filed Nov. 29, 2001, and assigned to the assignee hereof.

U.S. Patent Application, entitled "Semiconductor Device Structure and Method for Forming," filed concurrently herewith, and assigned to the assignee hereof.

FIELD OF THE INVENTION

The present invention relates generally to a semiconductor device structure and more specifically to trench isolation structures.

RELATED ART

The ability to integrate a wider variety of devices and structures into a single integrated circuit allows for increased speed and efficiency while reducing costs. However, problems arise during the integration of these different devices and structures. For example, some integrated circuits require multiple types of shallow trench isolation having different properties. An embedded non-volatile memory (NVM), for example, requires good trench corner rounding for bitcell reliability, endurance, and uniform program/erase threshold voltage distribution. However, logic devices located within a same integrated circuit as the NVM require narrower trenches but with less severe corner rounding as compared to the trenches within the embedded NVM. Filling of these narrower trenches, though, may result in voids, thus limiting the yield of the integrated circuit. Therefore, a need exists for the formation of semiconductor device structures within an integrated circuit having different isolation properties and requirements.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

An integrated circuit that has both non-volatile memory (NVM) and logic devices has different requirements for corner rounding for the NVM trench isolation than for the logic trench isolation. The NVM desirably has the greater trench corner rounding. The increase in corner rounding for the isolation for the NVM devices is achieved by implanting the NVM trench in one embodiment with a species that enhances the rate of growth of oxide. The logic trenches are masked from the implant. A subsequent growth of oxide causes a higher rate of growth and thus a greater thickness and thus greater rounding on the corner for the NVM trenches than for the logic trenches. In an alternate embodiment the logic trenches are implanted with a material that retards oxide growth. In such case, the NVM trenches are masked from the implant. The subsequent oxide growth is thus greater in the NVM trenches than it is in the logic trenches resulting in greater corner rounding in the NVM. The embodiments are better understood by reference to the figures.

Figure 1:
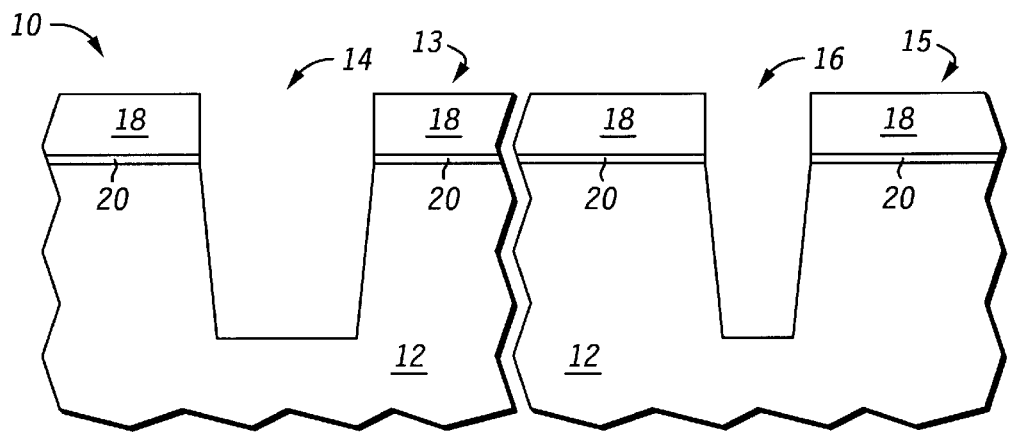
FIGS. 1–5 illustrate sequential cross sectional views of a semiconductor device made in accordance with one embodiment of the present invention.

Shown in FIG. 1 is a device structure 10 comprising a substrate 12 having a NVM portion 13 and a logic portion 15, a trench 14 in NVM portion 13, a trench 16 in logic portion 15, a nitride layer 18 and an oxide layer 20 underlying nitride layer 18. This shows that NVM trench 14 is wider than logic trench 16. A typical depth for these trenches 14 and 16 is 2000–6000 Angstroms. The width of the NVM trench 14 may be about 2500 Angstroms and the width of the logic trench 16 may be about 1100 Angstroms. The ratio may be for example, about two to one for the width of the NVM compared to the logic trenches. Oxide layer 20 is a pad oxide and is about 150 Angstroms and the nitride layer 18 is a pad nitride and is about 800–2000 Angstroms.

Figure 2:
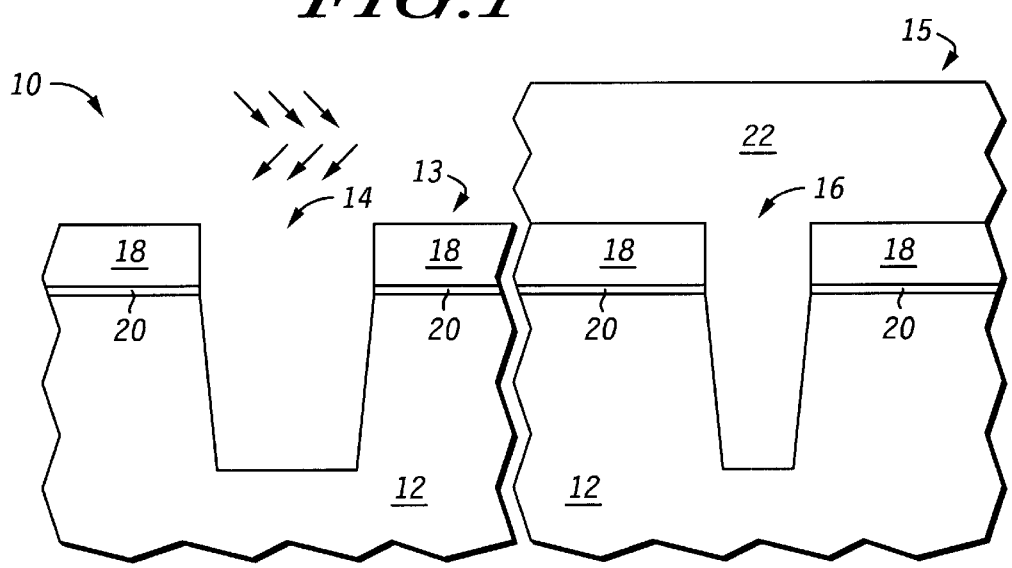
Figure 3:
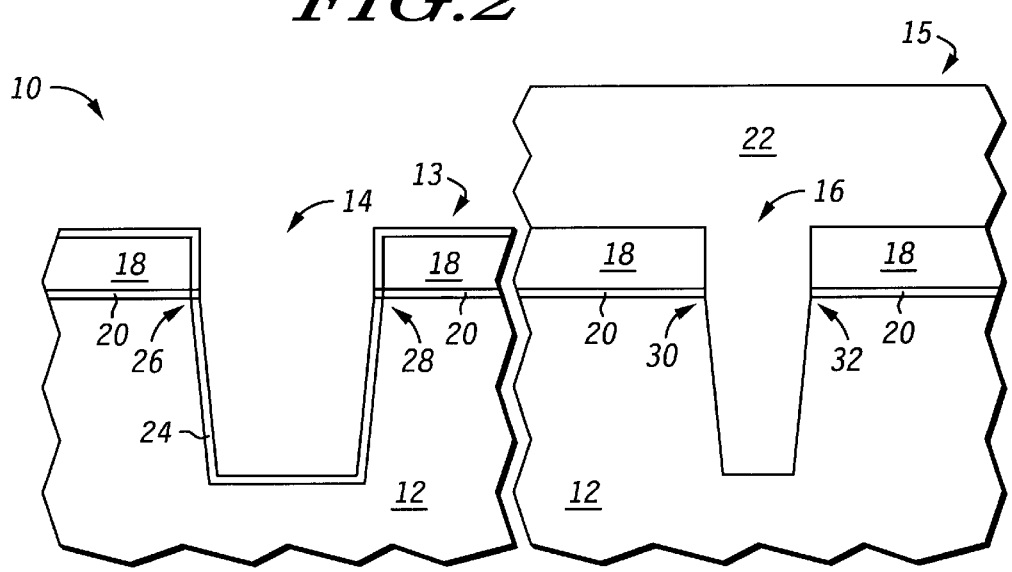

Shown in FIG. 2 is device structure 10 after a photo resist mask 22 has been formed and patterned over logic section 15. Subsequently, an implant that is multi-directional, such as is performed in halo implants, is applied to device structure 10. The photo resist mask 22 absorbs and completely blocks such implant from logic section 15, but NVM section 13 receives this implant. The result of this implant is shown in FIG. 3 by the formation of a doped region 24 in trench 14 as well as doped regions at the exposed portions of oxide layer 20 and nitride layer 18. A corner 26 and a corner 28 in the upper portion of trench 14 at the point it interfaces with oxide layer 20 are part of the doped region 24. Trench 16 has similar corners 30 and 32 at the upper portions of trench 16. The implant is of a species that causes the substrate material to be faster growing with respect to oxide formation. Fluorine is effective for a silicon substrate, which is a typical choice for a substrate material. The implant needs to be at the surface and does not need to be particularly deep. The doping concentration of the fluorine, or other enhancing material, in the doped region 24 is adjusted to obtain a desired oxide growth differential from that of the undoped silicon. Trench 16 in the logic portion 15 does not receive this implant so that the silicon surface of trench 16 does not have the enhanced oxide growth doped region.

Figure 4:
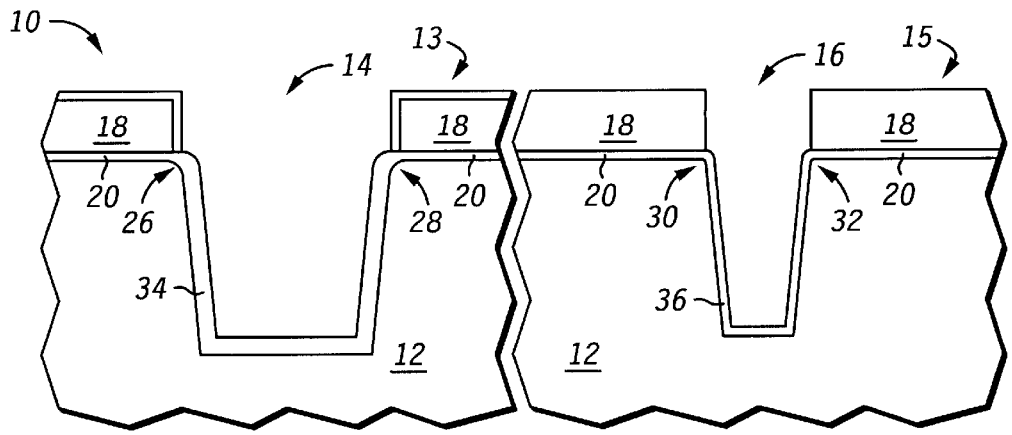

Shown in FIG. 4 is device structure 10 after photoresist 22 has been removed and an oxide layer 34 has been thermally grown in trench 14 and an oxide layer 36 has been grown in trench 16 to form insulated trenches. The thickness of oxide layer 34 is substantially greater than that of oxide layer 36. The result of this substantially thicker oxide 34 is that corners 26 and 28 are substantially more rounded than the rounding that occurs at corners 30 and 32. The oxide growth does cause some rounding in corners such as corners 30 and 32, however the degree of rounding is greater as the thickness of the oxide increases. Thus, the radius of curvature for corners 30 and 32 is significantly less than the radius of curvature for corners 26 and 28. The growth of oxide layer 34 is shown as consuming doped region 24, but that it may be that it may be desirable that some portion of doped region 24 would remain after the oxide growth. A benefit of the increased corner rounding is that the subsequent formation of polysilicon that overlaps those corners does not have the problems associated with corners that are sharp. An issue with NVM is the location where electrons tunnel during the programming and erasing of the cells. It is undesirable for the tunneling to occur at the trench corner.

When trench corners are sharp, tunneling is concentrated at the trench corners. When corners are rounded, the tunneling occurs across the channel instead of occurring just at the trench corners where the polysilicon floating gate crosses the isolation, which in this case would be trench 14. With sufficient corner rounding, the corner of the trench is not the primary location for the tunneling and thus does not become a cause of poor reliability. For present technologies the desired ratio of curvature for corners 26 and 28 is greater than 200 angstroms. The requirement for logic is much less stringent. The radius of curvature of the logic trench corners can be significantly less than 200 Angstroms. With the extra oxide growth present in oxide layer 34, the radius of curvature for corners 26 and 28 is easily made to exceed the 200 angstroms. Oxide layers 34 and 36 are necessary as liner oxides to compensate for the plasma damage that occurs during the trench etch process, but oxide layer 36 needs to be relatively thin in order to allow trench 16 to be filled without any voids. Trench 14 is significantly wider than trench 16 so that the additional oxide growth does not cause trench 14 to become too narrow so that it can still be filled with desirable isolation materials without voids.

Figure 5:
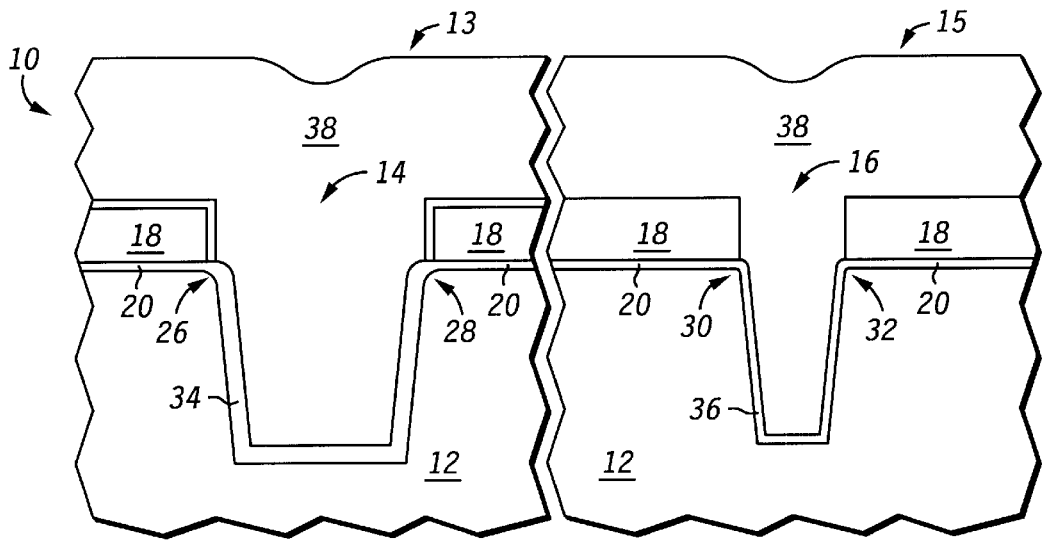

Shown in FIG. 5 is device structure 10 after an oxide layer 38, which is an isolation fill material, over NVM portion 13 and logic portion 15. This shows that the isolation fill material fills trenches 14 and 16 without void formation. This oxide layer is subsequently polished using chemical mechanical polishing (CMP), and subsequently nitride layer 18 is removed. The device structure 10 is then available for transistor formation according to normal processing.

Figure 6:
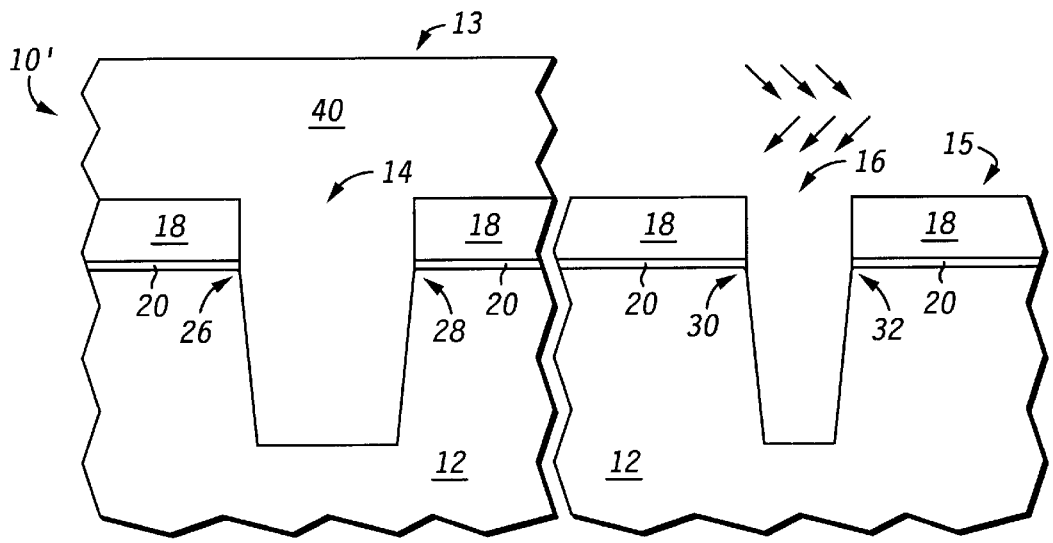
FIGS. 6–9 illustrate sequential cross sectional views of a similar device structure made in accordance with an alternate embodiment of the present invention.

Shown in FIG. 6 is a device structure 10' that is similar to device structure 10 shown in FIG. 3. The difference is that the masking layer is over the NVM portion 13 instead of over the logic portion 15. Common numbers are retained for those elements that are in common with FIG. 3. Trench portion 13 of device structure 10' is covered by a photoresist layer 40 and logic portion 15 receives an implant that is multi-directional. The photoresist layer 40 blocks the implant for NVM portion 13. In this case the implant is by a species, shown by arrows in FIG. 6, that retards oxide growth of substrate 12. Such a material, for the case in which the substrate is silicon, is nitrogen. Nitrogen effectively slows the growth of oxide on silicon. The multi-directional aspect of the implant is achieved in conventional manner. One such common usage of a multi-directional implant is for halo implants in channel regions of transistors. The same techniques can be utilized for the multi-directional implant shown here in FIG. 6 and in FIG. 2.

Figure 7:
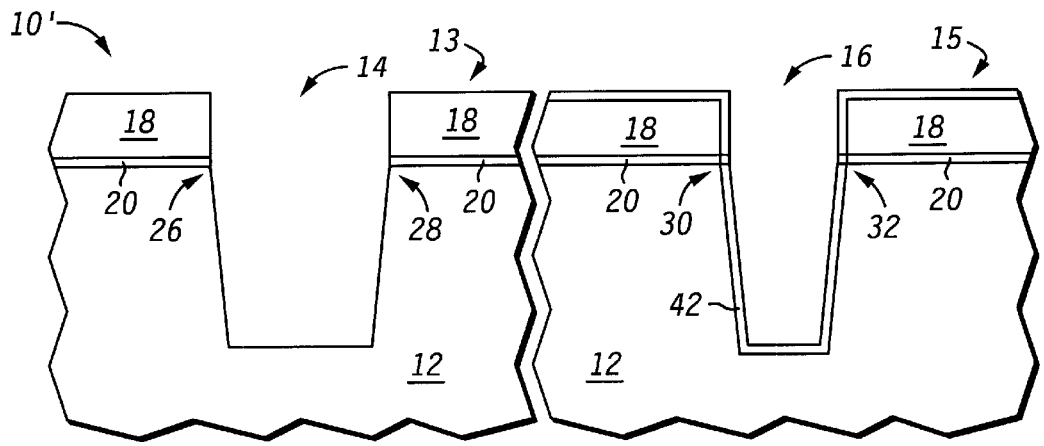
Figure 8:
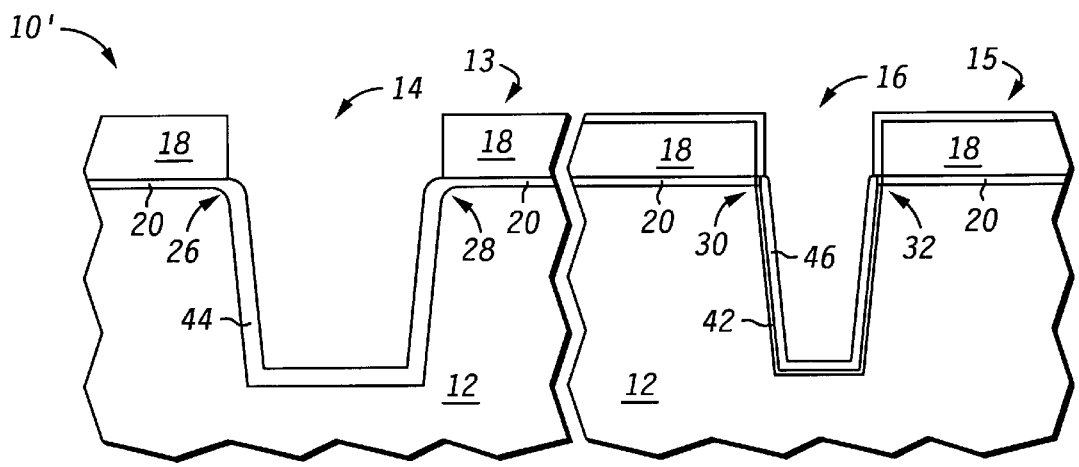

The effect of the implant on device structure 10' is shown in FIG. 7 by the formation of a doped region 42. In this case doped region 42 is silicon doped with nitrogen. The nitrogen also dopes the oxide layer 20 and nitride layer 18 of logic portion 15. A subsequent oxide growth is performed on device 10' as shown in FIG. 8. In this case an oxide layer 44 is formed in trench 14, and an oxide layer 42 is formed in trench 16. In this case oxide layer 42 is significantly thinner than oxide layer 44. Oxide layer 44 is grown at the rate that is for undoped silicon but oxide layer 42 is grown at the retarded rate due to the doping of the nitrogen in the silicon present in trench 16. Similarly as shown in FIG. 4 corners 26 and 28 have substantially more rounding than corners 30 and 32 because of the significantly greater thickness of oxide layer 44. The amount of oxide growth is sufficient to obtain the desired radius of curvature for corners 26 and 28. Currently that is about 200 angstroms which could change based on technology developments in which case the amount of oxide growth can be adjusted to obtain the desired radius of curvature.

Figure 9:
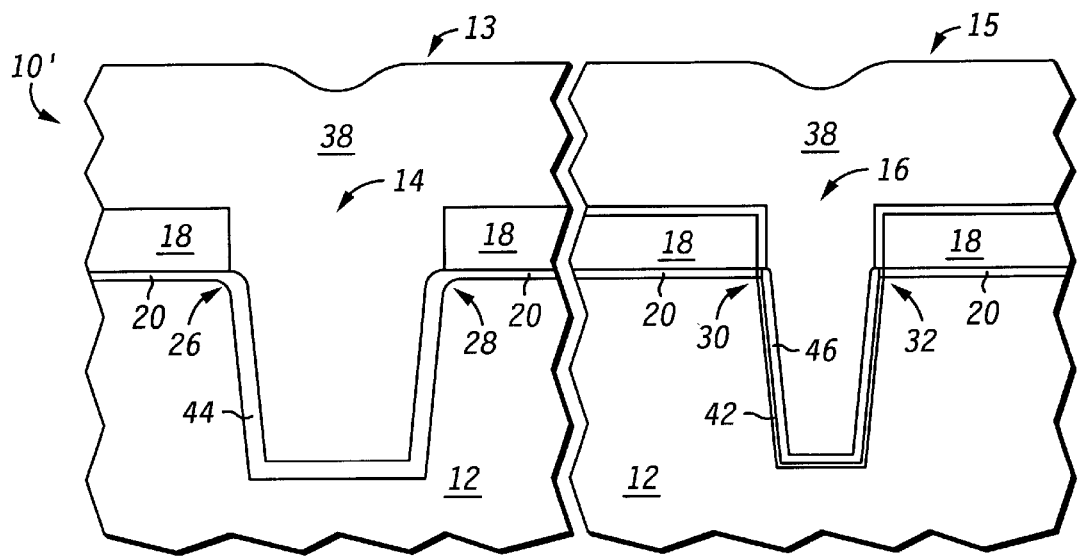

Similarly the growth of oxide 42 can be retarded by adjusting the doping level in the silicon. With trench 14 being significantly wider than trench 16, again the significantly more growth of oxide 44 compared to oxide 42 does not cause a problem with filling trench 14. Shown in FIG. 9 is device structure 10' after trenches 14 and 16 have been filled. This fill is void free because oxide layer 42 is sufficiently thin so as to not create a problem in filling trench 16. The fill material can be any desirable material for isolation between transistors. An example of such a material is deposited high density plasma oxide.

Another alternative is to modify the growth rate of oxide from both the NVM trenches and the logic trenches. The oxide growth rate differential can be increased by both retarding the oxide growth rate in the logic trenches and enhancing the oxide growth rate in the NVM trenches. This can be achieved by implanting the retarding species into the logic trenches while masking the NVM trenches and then implanting the enhancing species into the NVM trenches; while masking the logic trenches. This requires two masking steps instead of one, but these are not precision masking steps and should not adversely effect manufacturing yield. The additional oxide growth differential may prove beneficial in preventing excessive narrowing of the logic trenches while achieving the desired corner rounding of the NVM trenches. This corner rounding technique is not limited to NVM embedded with logic, but may be applicable to other situations in which there is a benefit in achieving a differential in corner rounding.

Thus it is seen that by modifying the oxide growth rate between the liners of two different trenches, a difference in the corner rounding can be achieved. The modification in growth rate in the disclosed embodiments utilizes implants of species into a trench of silicon that increase or slow the growth rate of oxide. By masking one trench and implanting the other, a modification in the oxide growth rate is achieved. There may be alternative techniques for establishing the differential growth rate. One trench may receive a modifying species by technique other than implanting such as diffusion.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device structure in a semiconductor layer, comprising:

forming a first trench of a first width and a first corner and forming a second trench of a second width and a second corner, the first width differing from the second width;

forming a mask overlying the second trench;

creating a modifying layer that modifies oxidation rate of exposed portions of the semiconductor device structure not covered by the mask;

removing the mask; and thermally growing an insulating layer on the semiconductor structure to form an insulated first trench and an insulated second trench.

2. The method of claim 1 wherein the thermally growing of the insulating layer modifies the first corner to have a radius of curvature that is substantially greater than the second corner.

3. The method of claim 1 wherein the creating of the modifying layer further comprises one of implanting a species that modifies oxidation rate or depositing a species that modifies oxidation rate.

4. The method of claim 3 further comprising implementing the species as a member of the halide family of elements.

5. The method of claim 1 wherein the creating of the modifying layer that modifies oxidation rate further comprises:

implanting a species that enhances oxidation.

6. The method of claim 1 wherein the creating of the modifying layer that modifies oxidation rate further comprises:

implanting a species that retards oxidation.

7. The method of claim 6 further comprising implanting the species that retards oxidation as nitrogen.

8. The method of claim 1 further comprising:

forming the first trench within a memory portion of the semiconductor device structure and forming the second trench within a logic circuitry portion of the semiconductor device structure.

9. The method of claim 1 further comprising:

thermally growing the insulating layer as an oxide layer.

10. The method of claim 1 further comprising:

thermally growing the insulating layer to grow a trench oxide liner that is thicker in the first trench than in the second trench.

11. The method of claim 1 further comprising:

forming a barrier layer and a stress relief layer over the semiconductor layer in areas adjacent to the first trench and the second trench, the barrier layer and the stress relief layer inhibiting the thermally growing of the insulating layer and the implanting of the species that modifies oxidation rate.

12. A semiconductor device structure formed in a semiconductor layer, comprising:

a first trench of a first width and a first corner;

a second trench of a second width that differs from the first width, the second trench having a second corner; and a grown insulator in the first trench and in the second trench;

wherein the first corner has a first radius of curvature that is substantially larger than a second radius of curvature of the second corner; and wherein the grown insulator in the first trench comprises a material that enhances oxidation rate within the first trench as compared to oxidation rate within the second trench.

13. The semiconductor device of claim 12 further comprising:

a pad nitride and a pad oxide adjacent to the first trench and the second trench.

14. A semiconductor device structure formed in a semiconductor layer, comprising:

a first trench of a first width and a first corner;

a second trench of a second width that differs from the first width, the second trench having a second corner; and a grown insulator in the first trench and in the second trench;

wherein the first corner has a first radius of curvature that is substantially larger than a second radius of curvature of the second corner; and wherein the grown insulator in the second trench comprises a material that retards oxidation rate within the second trench as compared to oxidation rate within the first trench.

15. A method for forming a semiconductor device structure in a semiconductor layer, comprising:

forming a first trench of a first width in the semiconductor layer;

forming a second trench of a second width in the semiconductor layer; and substantially simultaneously forming an insulating layer within the first trench and the second trench by using different oxidation rates in the first trench and the second trench and wherein forming the first trench and forming the second trench further comprise implementing the first width and the second width as substantially equal widths.

16. A method for forming a semiconductor device structure in a semiconductor layer, comprising:

forming a first trench of a first width in the semiconductor layer;

forming a second trench of a second width in the semiconductor layer; and substantially simultaneously forming an insulating layer within the first trench and the second trench by using different oxidation rates in the first trench and the second trench;

wherein forming an insulating layer within the first trench and the second trench by using different oxidation rates further comprises implanting a species in the first trench that enhances oxidation.

17. A method for forming a semiconductor device structure in a semiconductor layer, comprising:

forming a first trench of a first width in the semiconductor layer;

forming a second trench of a second width in the semiconductor layer; and substantially simultaneously forming an insulating layer within the first trench and the second trench by using different oxidation rates in the first trench and the second trench;

wherein forming an insulating layer within the first trench and the second trench by using different oxidation rates further comprises implanting a species in the first trench that retards oxidation.

18. A method for forming a semiconductor device structure in a semiconductor layer, comprising:

forming a first trench of a first width in the semiconductor layer;

forming a second trench of a second width in the semiconductor layer; and substantially simultaneously forming an insulating layer within the first trench and the second trench by using different oxidation rates in the first trench and the second trench;

wherein forming an insulating layer within the first trench and the second trench by using different oxidation rates further comprises implanting a species in the first trench that enhances oxidation and implanting a species in the second trench that retards oxidation.

19. A method for forming a semiconductor device structure in a semiconductor layer, comprising:

forming a first trench of a first width in the semiconductor layer;

forming a second trench of a second width in the semiconductor layer; and substantially simultaneously forming an insulating layer within the first trench and the second trench by using different oxidation rates in the first trench and the second trench;

wherein forming an insulating layer within the first trench and the second trench by using different oxidation rates further comprises selectively depositing a predetermined material in the second trench that retards oxidation.

20. The method of claim 16 further comprising:

identifying an area of an integrated circuit containing the semiconductor device that requires high reliability and implementing the first trench in the area.

21. The method of claim 16 further comprising:

forming the first trench having a corner with a radius of curvature that is substantially greater than a radius of curvature of a corner of the second trench.

* * * * *